United States Patent
Sim (10) Patent No.: US 7,020,024 B2
(45) Date of Patent: Mar. 28, 2006

(54) METHODS AND DEVICES FOR INCREASING VOLTAGES ON NON-SELECTED WORDLINES DURING ERASURE OF A FLASH MEMORY

(75) Inventor: Soung-Hoon Sim, Gwangyeok-shi (KR)

(73) Assignee: Samsung Electronics Co., Ltd., (KR)

( * ) Notice: Subject to any disclaimer, the term of this patent is extended or adjusted under 35 U.S.C. 154(b) by 36 days.

(21) Appl. No.: 10/403,468

(22) Filed: Mar. 31, 2003

(65) Prior Publication Data

US 2003/0189864 A1 Oct. 9, 2003

(30) Foreign Application Priority Data

Apr. 4, 2002 (KR) .......................... 2002-0018451

(51) Int. Cl.
*G11C 16/06* (2006.01)
*G11C 16/04* (2006.01)
*G11C 8/00* (2006.01)

(52) U.S. Cl. .......................... 365/185.23; 365/185.05; 365/185.18; 365/185.29; 365/72; 365/230.06

(58) Field of Classification Search ........... 365/185.23, 365/185.24, 185.29, 185.05, 185.18, 72, 365/230.06

See application file for complete search history.

(56) References Cited

U.S. PATENT DOCUMENTS

| | | | | |
|---|---|---|---|---|
| 5,341,334 | A | * | 8/1994 | Maruyama .............. 365/189.11 |
| 5,659,503 | A | * | 8/1997 | Sudo et al. ............... 365/185.2 |
| 5,901,083 | A | * | 5/1999 | Atsumi et al. .......... 365/185.11 |
| 5,914,896 | A | * | 6/1999 | Lee et al. ............... 365/185.19 |
| 6,021,083 | A | * | 2/2000 | Shiau et al. ............ 365/230.01 |
| 6,134,157 | A | * | 10/2000 | Takeuchi ..................... 365/200 |
| 6,222,773 | B1 | * | 4/2001 | Tanzawa et al. ........ 365/185.28 |
| 6,381,670 | B1 | * | 4/2002 | Lee et al. ..................... 711/103 |
| 2001/0003511 | A1 | * | 6/2001 | Taura et al. ............ 365/185.23 |
| 2001/0021128 | A1 | * | 9/2001 | Kim ....................... 365/185.23 |
| 2002/0159298 | A1 | * | 10/2002 | Hirano .................... 365/185.29 |
| 2003/0128587 | A1 | * | 7/2003 | Nakamura ............. 365/185.11 |
| 2003/0133325 | A1 | * | 7/2003 | Silvagni et al. ......... 365/185.11 |

FOREIGN PATENT DOCUMENTS

JP 11017154 A * 1/1999

* cited by examiner

*Primary Examiner*—Viet Q. Nguyen
*Assistant Examiner*—Ly Duy Pham
(74) *Attorney, Agent, or Firm*—Myers Bigel Sibley, & Sajovec, PA (57) ABSTRACT

A flash memory can operate by providing a first voltage level from a row decoder to a wordline associated with a cell of a flash memory device. An address provided to the row decoder is decoded during an erase mode operation of the flash memory. The first voltage level is increased to a second voltage level provided from the row decoder to the wordline responsive to determining that the wordline is not selected by the address during the erase mode operation.

17 Claims, 5 Drawing Sheets

(Prior Art)

METHODS AND DEVICES FOR INCREASING VOLTAGES ON NON-SELECTED WORDLINES DURING ERASURE OF A FLASH MEMORY

RELATED APPLICATION

This application claims priority to Korean Patent Application No. 2002-18451, filed on Apr. 4, 2002, the entire content of which is incorporated herein by reference.

FIELD OF THE INVENTION

The present invention generally relates to flash memories and, more specifically, to wordline decoders in flash memories.

BACKGROUND

Flash memories have operating modes that can differ from other types of memories, such as program and erase modes. During these operating modes, various voltage levels may be applied to a wordline associated with a memory cell to cause what is commonly referred to as Fowler-Nordheim (FN) tunneling (such as when a memory cell is being programmed or erased).

A split-gate type memory cell may be advantageous to use in a flash memory as it may provide improved immunity against an over-erasure effect compared to stacked gate memory cells, due to the fact that the gates are isolated from bitlines by portions of transistor selection in those cell regions.

Figure 1A:
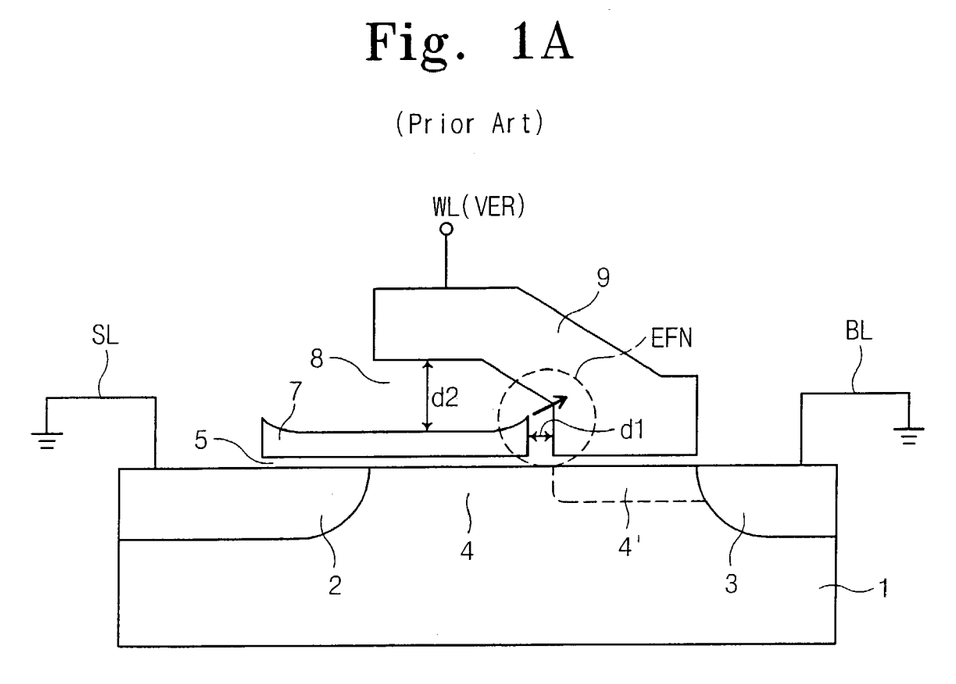
FIGS. 1A and 1B are cross-sectional views of a conventional split-gate memory flash memory cell.
Figure 1B:
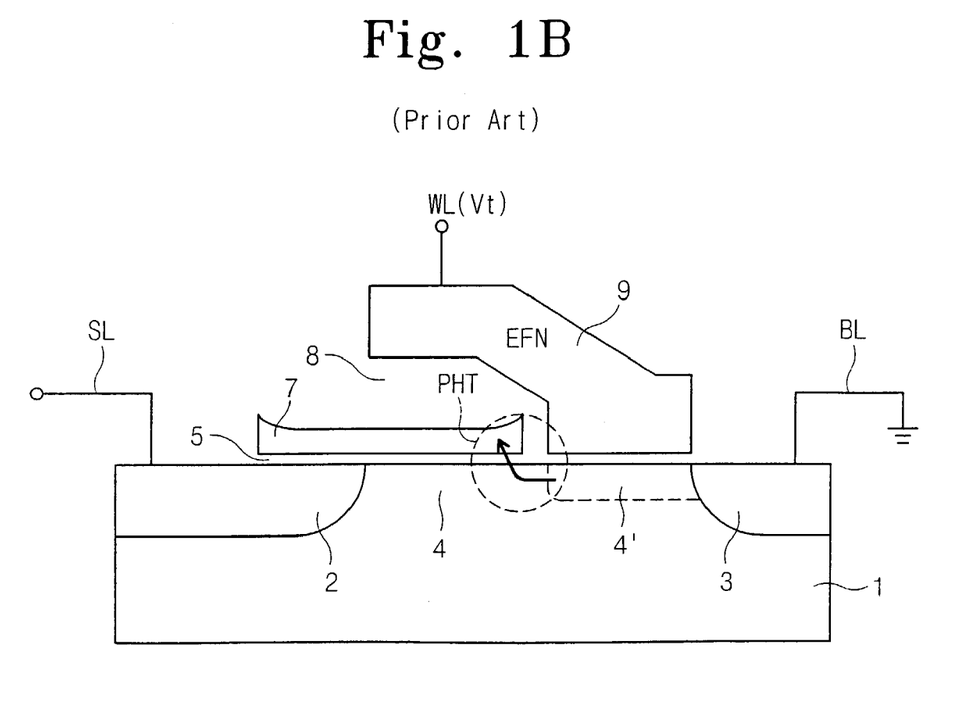

As shown in FIGS. 1A and 1B, a split-gate memory cell can include a floating gate 7 of a polysilicon layer (or a polycide layer) covering parts of a source region 2 and a channel region 4 of a semiconductor substrate 1 by interposing an oxide layer 5 between the channel region 4 and the floating gate 7 having a thickness about 15 nm. The channel region 4 is defined between the source region 2 and a drain region 3 formed in the substrate 1. A control gate 9 of polysilicon is formed over the floating gate 7 and the channel region 4. An oxide layer 8 is between the floating gate 7 and the control gate 9. The oxide layer 8 can be thicker along a vertical distance d2 (about 200 nm) than a lateral distance d1 (about 40 nm). The narrower distance d1 between the side of the floating gate 7 and the control gate 9 can enable electrons to migrate from the floating gate 7 to the control gate 9 by way of a space EFN by FN tunneling.

In a memory cell array, the control gate 9 is coupled to a wordline WL and the source and drain regions, 2 and 3, are connected respectively to a source line SL and a bitline BL. The wordlines and source lines are arranged in rows and the bitlines are arranged in columns. One page in the memory cell array can be associated with a pair of wordlines having, for example, even and odd numbering.

The following Table 1 summarizes voltage bias conditions for conducting the operating modes of programming, erasing, and reading in the split-gate memory cell.

TABLE 1

| Operation Mode | Programming | Erasing | Reading |
|---|---|---|---|
| Wordline (WL) | VPGM (11~15 V) | VER (11~15 V) | Vref |
| Bitline (BL) | VCC ("1"); program inhibit VSS ("0"); program | VSS | 1~2 V |
| Source Line (SL) | 10~12 V | VSS | VSS |

As shown in Table 1, when erasing the memory cell (refer to FIG. 1A), the control gate 9 is charged up to the erasing voltage of 11~15V on the wordline WL while the source and drain regions, 2 and 3, are set to ground (VSS) through the source line SL and the bitline BL. The high-level erasing voltage VER causes electrons (or negative charges) on the floating gate 7 to move into the control gate 9 by the FN tunneling effect, which is sometimes referred to as "forward tunneling". As a result, a threshold voltage of the memory cell can be decreased depending on the amount of positive charge remaining in the floating gate 7. In this state, the memory cell is conductive in response a reference voltage Vref applied to the wordline WL during the read mode. Such a memory cell is referred to being erased which is indicated as storing data equal to a logical "1".

Referring to FIG. 1B, programming the split-gate memory cell is accomplished by applying a threshold voltage Vt to the wordline WL, applying 10~12V to the source line SL and VSS to the bitline BL. The power supply voltage (corresponding to data "1") can be provided to non-selected bitlines. A threshold voltage level of Vt at the control gate 9 induces a conductive field 4' in the channel region 4, by which electrons are forced to the floating gate 7 by a hot electron effect while flowing towards the source region 2. The electrons trapped in the floating gate 7 can increase the threshold voltage of the memory cell.

In read mode, the wordline, the bitline, and the source line are charged with the reference voltage Vref, 1~2V, and VSS, respectively. A read data bit of "1" corresponds to a normally erased memory cell while "0" corresponds to a normally programmed memory cell.

As discussed above, high voltage levels may be needed for programming and erasing operations. In particular, a very high voltage may be needed to provide the FN tunneling effect during the erasing operation. For example, a split-gate memory cell formed using a design rule of 0.35 μm may need a voltage of 12.5V applied to the wordline during the erasing operation which may be less than the breakdown voltage of a high-voltage specific MOS (HV-MOS) transistor (which may be about 13V). However, the breakdown voltage of a HVMOS transistor may be reduced as the design rule is reduced. For example, if a design rule of 0.1 μm is used, the breakdown voltage of the HVMOS transistor may be reduced to about 11V despite the fact that a wordline voltage of 11.5V may need to be maintained to ensure that the selected memory cells are properly erased.

Figure 2:
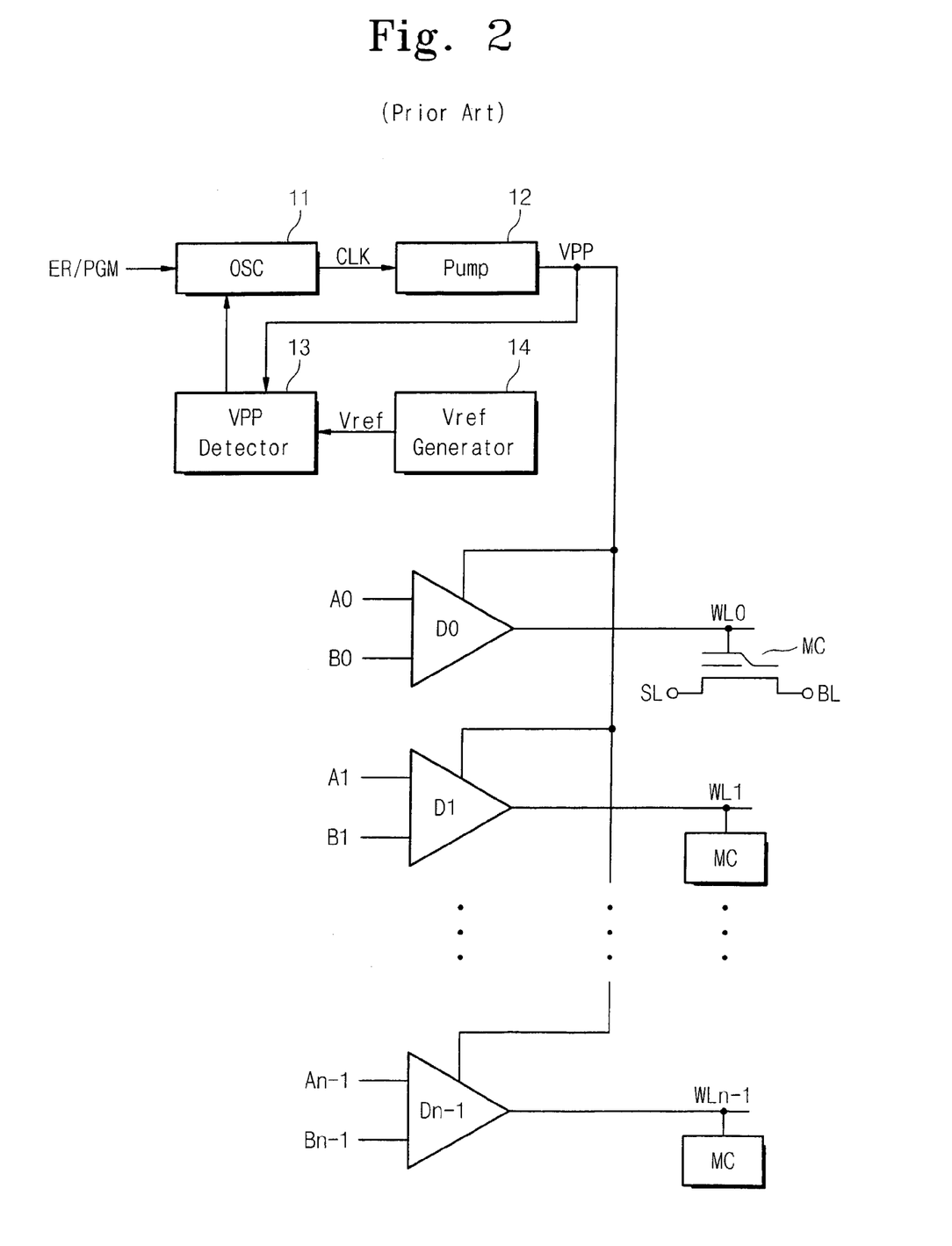
FIG. 2 is a schematic view illustrating a conventional arrangement of wordline decoders for transferring high voltages to wordlines.

The types of the erasing operations may be classified into two groups in accordance with the unit of the flash memory being erased: 1) sector erasure mode and 2) chip erasure mode. A sector may be defined as one page of the flash memory or a plurality of pages. Therefore, the wordline decoders D0~Dn-1 may all be selected (i.e., having a voltage of 11.5V (VPP) applied to all the wordlines) in the chip erasure mode, or alternatively, selected in the sector erasure mode.

Figure 3:
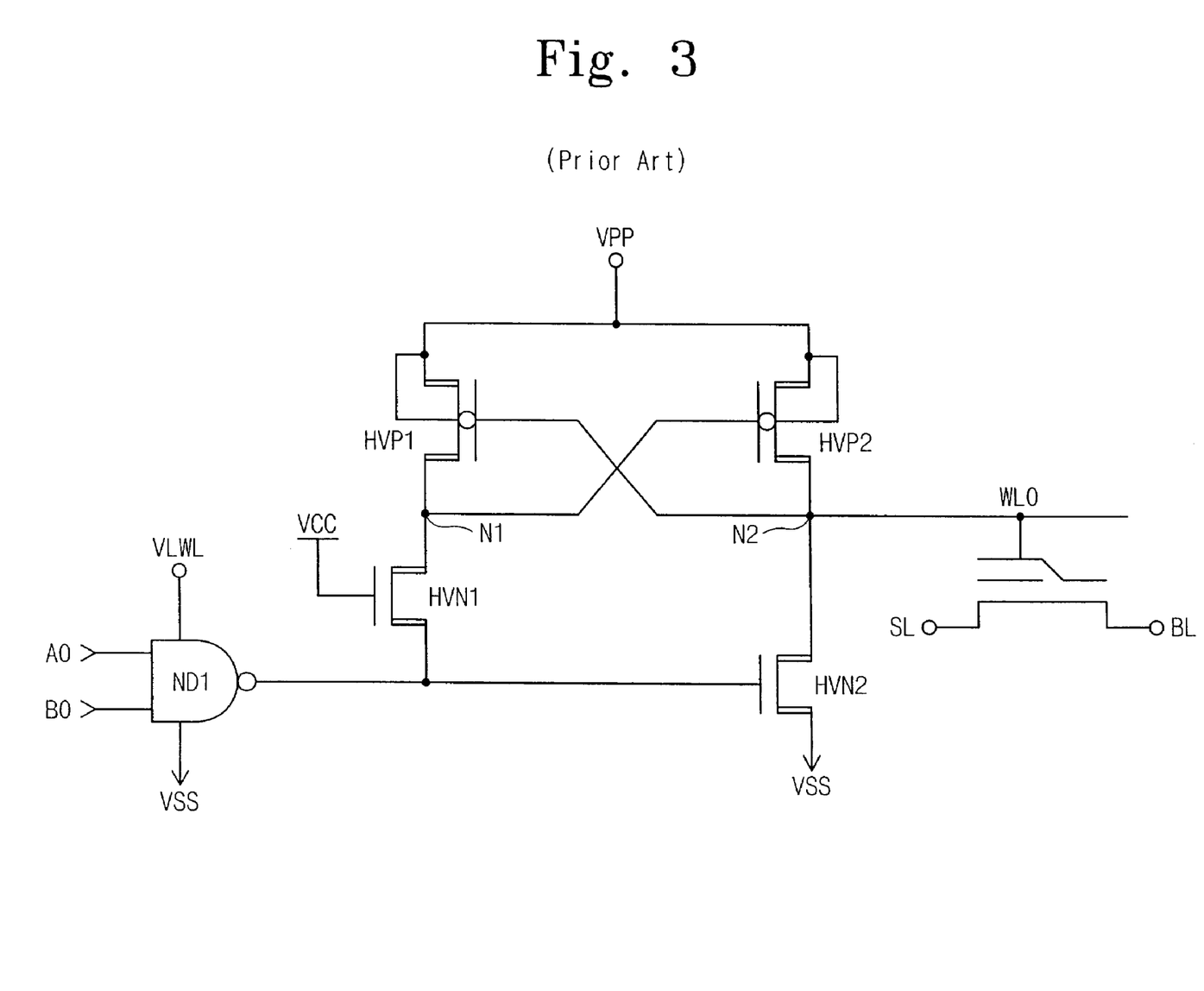
FIG. 3 illustrates a conventional internal circuit of a wordline decoder.

The wordline decoder of FIG. 2 is shown in FIG. 3. The wordline decode is a type a level shifter that transfers VPP to its associated wordline. In the sector erasure mode, if the wordline decoder of FIG. 3 is selected, a NAND gate ND1 outputs a low-level signal in response to high-level address signals A0 and B0. High-voltage NMOS and PMOS transistors, HVN2 and HVP2, become non-conductive and conductive, respectively. A VPP of 11.5V is transferred to a selected wordline WL0 through the PMOS transistor HVP2. A high-voltage PMOS transistor HVP1 is non-conductive to keep a gate of the PMOS transistor HVP2 at a low level since a gate of HVP1 is coupled to the selected wordline WL0 of VPP.

On the other hand, if the wordline decoder of FIG. 3 is not included in the sector selected for erasure (i.e., not selected), the NAND gate ND1 outputs a high-level signal because at least one of the address signals A0 and B0 is set to a low level. The NMOS transistor HVN2 becomes conductive, thereby causing the corresponding wordline WL0 to be set to a low level (i.e., a ground voltage level). As the non-selected wordline WL0 is held to the ground voltage, the PMOS transistor HVP1 becomes conductive and the PMOS transistor HVP2 becomes non-conductive.

To properly erase the memory cells in the selected sector, a source-to-drain voltage of the PMOS transistor HVP2 should be maintained at 11.5V. However, as smaller design rules (e.g., 0.18 µm) are used, narrower gate widths and shorter channel lengths are formed (or a distance between a source and a drain). These reductions in dimensions may make the device more susceptible to leakage current and may cause the breakdown voltage of a high-voltage MOS transistor (e.g., HVP2) to be reduced. For example, as discussed above, if the breakdown voltage of the high-voltage PMOS transistor is 11V, it may be difficult to maintain the source-to-drain voltage of the PMOS transistor HVP2 at the level needed to ensure proper operation (e.g. 11.5V in this example).

On the other hand, the chip erasure mode is conducted with a larger number of wordline decoders than those selected in the sector erasure mode. In this erasure mode, a source-to-drain voltage of the high-voltage PMOS transistor HVP1 should be maintained at the VPP level. However, the PMOS transistor HVP1, which may be smaller than the PMOS transistor HVP2, may not be capable to endure the stress associated such a high source to drain voltage thereby increasing the likelihood of breakdown occurring and a non-selected wordline having VPP is transferred to the non-selected wordline. Applying VPP to non-selected wordlines during an erasure mode may cause malfunctions of erasure operations in the flash memory.

SUMMARY

Embodiments according to the present invention can provide flash memory device that increase non-selected wordline voltages during erasure. Pursuant to these embodiments, a flash memory can operate by providing a first voltage level from a row decoder to a wordline associated with a cell of a flash memory device. An address provided to the row decoder can be decoded during an erase mode operation of the flash memory. The first voltage level can be increased to a second voltage level provided from the row decoder to the wordline responsive to determining that the wordline is not selected by the address during the erase mode operation.

In some embodiments according to the present invention, the first voltage level can be increased to a third voltage level that is greater than the second voltage level to the wordline responsive to determining that the wordline is selected by the address during the erase mode operation. In some embodiments according to the present invention, the second voltage level is less than that needed to erase a memory cell electrically coupled to the non-selected wordline.

In some embodiments according to the present invention, increasing the first voltage level to the second voltage level can include increasing a gate voltage towards a first reference voltage at a gate terminal of a transistor having an output electrically coupled to the wordline to provide the second voltage level and increasing a second reference voltage to a source/drain terminal of the transistor to increase the first voltage level on the wordline towards the first reference voltage to provide the second voltage level. In some embodiments according to the present invention, increasing the second reference voltage can include delaying increasing the second reference voltage for a time interval based on a time for the gate voltage to increase above the second reference voltage.

In some embodiments according to the present invention, the transistor can be a first transistor and wherein methods embodiments can further include decreasing a source to drain voltage across a second transistor, having a source/drain terminal thereof electrically coupled to the wordline, as the second reference voltage is increased. In some embodiments according to the present invention, the second reference voltage can be a pseudo-ground voltage.

In some embodiments according to the present invention, decoding can include passing a gate voltage through a pass transistor to a gate terminal of a transistor having an output electrically coupled to the wordline to provide the second voltage level.

In some embodiments according to the present invention, a flash memory can operate by increasing a pseudo-ground voltage to an output stage of a row decoder to increase a voltage applied to a non-selected wordline electrically coupled to the output stage. In some embodiments according to the present invention, the increase in the pseudo-ground voltage is based on a control signal of the flash memory.

In some embodiments according to the present invention, the reliability of erasure operations in a split-gate flash memory may be improved. The invention prevents a high voltage from being transferred into non-selected wordlines during an erasure operation against a selected wordline or a sector in a split-gate flash memory. It may not occur an erasure fail due to a weak breakdown endurance of a high-voltage PMOS transistor for transferring an erasure voltage to a wordline in a split-gate flash memory.

According to an aspect of the present invention, there is provided a flash memory including: a split-gate memory cell having source and drain regions formed in a semiconductor substrate, a channel region between the source and drain regions, a floating gate partially covering the source and channel regions, and a control gate over the channel region and the floating gate; a wordline connected to the control gate; and a wordline decoder configured to supply a first voltage to the wordline when the wordline decoder is selected while to supply a second voltage to the wordline when the wordline is non-selected, in an erasure mode.

The wordline decoder includes: first means configured to charge a node to a second voltage in response to a first signal delayed from an erasure signal during the non-selection; second means configured to charge the wordline to a second voltage in response to the node during the non-selection; a first transistor for connecting the wordline to the first voltage in response to the node; and a second transistor for connecting the node to the first voltage in response to the wordline.

The first means comprises a high-voltage depletion transistor whose gate is coupled to the first signal, and a high-voltage NMOS transistor, whose gate is coupled to the second signal, connected between an address input terminal and the node in parallel with the depletion transistor. The second means comprises a high-voltage NMOS transistor, whose gate is coupled to the node, connected between the wordline and the second signal.

The first and second signals are logically complementary each other. The second voltage is transferred to the wordline by the send means when the wordline decoder is non-selected. The first and second transistors are high-voltage PMOS transistors.

DESCRIPTION OF EMBODIMENTS ACCORDING TO THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. It also will be understood that when an element is described as being electrically "coupled" (or connected) to another element, it can be directly coupled to the other element or intervening elements may be present. In contrast, when an element is referred to as being "directly coupled" to another element, no intervening elements are present.

It will be understood that although the terms first and second are may be used herein to describe various elements these regions elements should not be limited by these terms. These terms are only used to distinguish one element from another. Thus, a first element discussed herein could be termed a second element and similarly, a second element may be termed a first element without departing from the teachings of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Unless otherwise defined, all technical and scientific terms used herein have the same meaning as commonly understood by one of ordinary skill in the art to which this invention belongs. All publications, patent applications, patents, and other references mentioned herein are incorporated by reference in their entirety.

Embodiments according to the present invention are also disclosed in reference to a timing diagram. It will be understood that the waveforms shown in the timing diagram illustrate exemplary operations of embodiments according to a particular sequence. However, it will be understood that other sequences are not excluded by sequence shown in the timing diagram.

Figure 4:
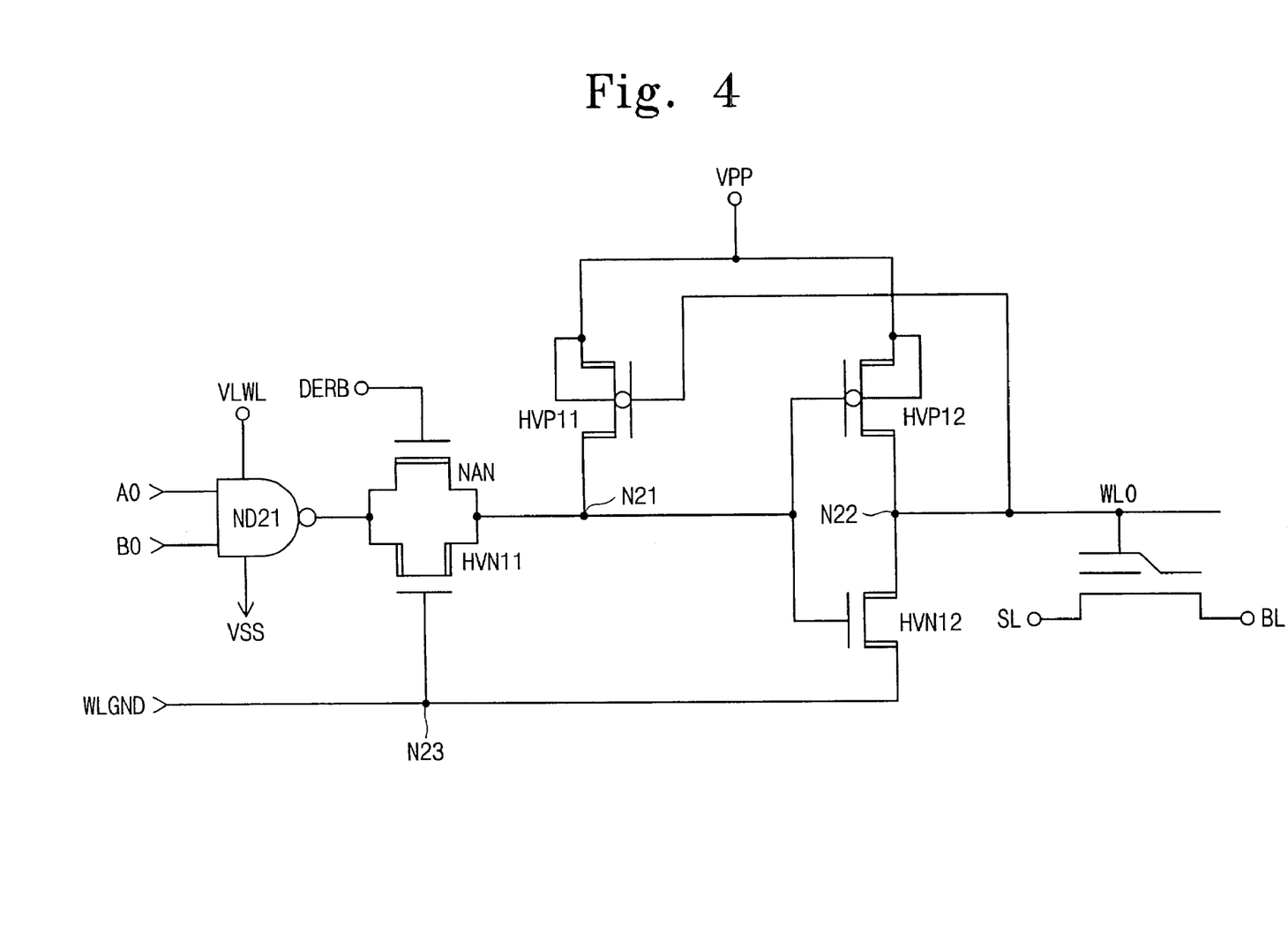
FIG. 4 is a circuit diagram that illustrates embodiments of wordline decoder circuits according to the present invention.

FIG. 4 illustrates embodiments of wordline decoders according to the present invention. A NAND gate ND21 generates a signal to enable or disable the wordline decoder in response to address signals A0 and B0. The output signal of the NAND gate ND21 is transferred (or passed) to a node N21 through a high-voltage NMOS depletion mode transistor NAN and/or a high-voltage NMOS enhancement mode transistor HVN11 that are coupled to one another in parallel as shown. A gate of the depletion transistor NAN is coupled to a delayed erasure signal DERB. A gate of the NMOS transistor HVN11 is coupled to a wordline control voltage signal WLGND. A high-voltage PMOS transistor HVP11 can couple the node N21 to a high voltage VPP. The gate of HVP11 is coupled to an output node N22. The node N21 is also coupled to the gates of high-voltage PMOS and NMOS transistors, HVP12 and HVN12. The PMOS transistor HVP12 can couple VPP to the output node N22. HVP12 and HVN12 can provide an output stage of the row decoder shown in FIG. 4.

The NMOS transistor HVN12 can couple the output node N22 to the wordline control voltage WLGND. The output node N22 is coupled to its corresponding wordline, e.g., WL0. Sources of the PMOS transistors HVP11 and HVP12 are connected in their common bulk. In some embodiments according to the present invention, the high-voltage PMOS transistor HVP11 has a channel that is smaller than that of the high-voltage PMOS transistor HVP12. It will be understood that the term "smaller" can refer to a combination of dimensions of length and width that provide an overall smaller area for the channel. Furthermore the NMOS transistors NAN, HVN11, and HVN12 can have smaller channels than the PMOS transistors HVP11 and HVP12. In some embodiments according to the present invention, a power supply voltage VCC is 1.5~1.8V, a threshold voltage of the high-voltage depletion transistor NAN is about 0.1V (VT) and a threshold voltage of the NMOS transistor HVN11 or HVN12 is about 0.5V (VT).

Figure 5:
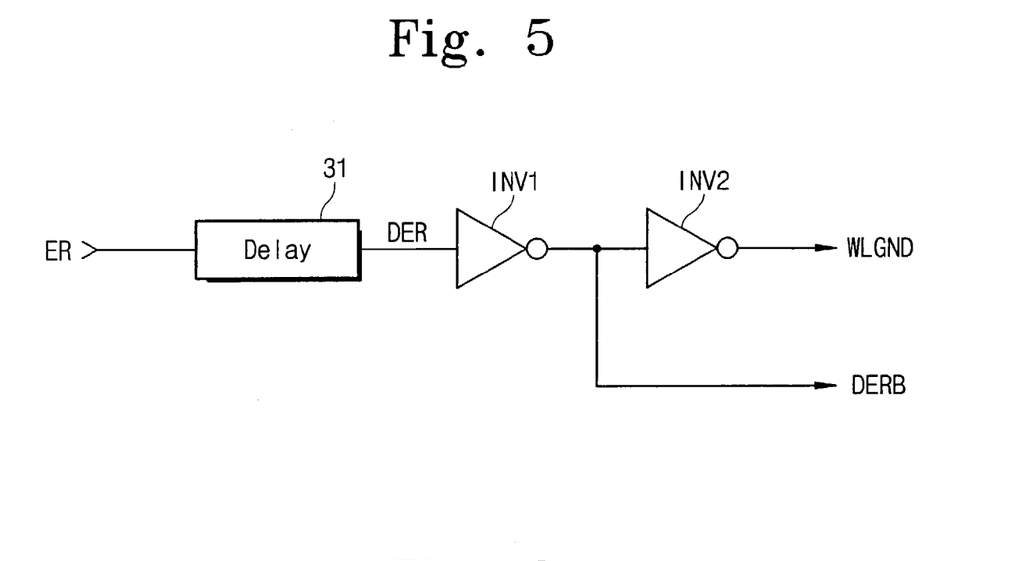
FIG. 5 is a diagram that illustrates embodiments of wordline decoder circuits according to the present invention.

FIG. 5 shows a circuit for generating the delayed erasure signal DERB and the wordline control voltage signal WLGND. Referring to FIG. 5, the erasure signal ER is delayed by a delay circuit 31 (having a delay of ΔT) to provide a delayed signal DER. The delayed signal DER passes through an inverter INV1 to provide a delayed erasure signal DERB. DERB is passed through an inverter INV2 to provide the wordline control voltage WLGND.

Operations of embodiments according to the present invention will now be described in greater detail in reference to FIG. 6. The signal levels in the waveforms in FIG. 6 correspond to where the corresponding wordline decoder is not selected. It will be understood, however, that a selected wordline decoder may operate in an analogous fashion.

If the wordline decoder shown in FIG. 4 is selected during a sector erasure mode (i.e., the ER signal is asserted high), the NAND gate ND21 outputs a low level signal (0V). The circuits discussed in reference to FIG. 5 provide the delay ΔT so that the wordline control voltage signal WLGND remains at a low level and the delayed erasure signal DERB remains at a high level (to make the transistors NAN and HVN11 conductive and non-conductive respectively) until the delay ΔT elapses. Thus, the high voltage VPP (11.5V) is applied to the selected wordline (e.g., WL0) through the high-voltage PMOS transistor HVP12 to erase the cells associated with the selected wordline. On the other hand, when the wordline decoder is not selected in the sector erasure mode, the NAND gate ND21 outputs a high level signal (VCC).

As discussed above, the delayed erasure signal DERB and the wordline control voltage signal WLGND maintain high and low levels respectively until ΔT after ER transitions from low to high whereupon the depletion transistor NAN is made conductive and the high-voltage NMOS transistor HVN11 is made non-conductive. The node N21 is charged up to VCC−Vt (1.5−0.1=1.4) while the wordline control voltage WLGND is maintained at 0.0V. The NMOS transistor HVN12 is turned on to discharge the wordline voltage to 0V and the PMOS transistor HVP12 is made non-conductive. The node N21 remains steady because HVP11 is not sufficiently conductive to raise the voltage at node N21 to VPP while the gate of the PMOS transistor HVP11 is coupled to the wordline.

During the delay time ΔT, the PMOS transistor HVP11 become sufficiently conductive to pull the N21 up to VPP. The voltage at the node N21 increases to VPP from the former VCC−Vt. As the delay time ΔT elapses (e.g., node N21 has reached a level sufficient to make the NMOS transistor HVN12 conductive), the delayed erasure signal DERB and the wordline control signal voltage WLGND become low and high levels respectively. Because the wordline control voltage (VCC level) is applied to the source of the NMOS transistor HVN12 and the node N21 (coupled to the gate of HVN12) is at VPP level (through HVP11), the wordline voltage is charged up to VCC via the high-voltage NMOS transistor HVN12. The NMOS transistor HVN11 can prevent a leakage current when the node N21 is at VPP. In some embodiments according to the present invention, the time delay ΔT is selected to allow the node N21 adequate time to be charged to VPP before beginning to increase the pseudo-ground voltage (WLGND) to the output stage of the row decoder.

Since the wordline voltage is at VCC and the wordline control signal voltage is VCC, in the condition of non-selection, a source-to-drain voltage of the PMOS transistor HVP12 is set to VPP−VCC, which may be about 10V (assuming, for example, that VPP=about 11.5V and VCC=about 1.5V in the case where 0.18 μm is used as the design rule). As a result, the source-to-drain voltage of the PMOS transistor HVP12, can be maintained at less than the associated breakdown voltage of HVP12 thereby reducing the possibility that VPP is coupled to the wordline. For example, a source to drain voltage across HVP12 of 10V can be less than the breakdown voltage of HVP12 (as discussed above).

Figure 6:
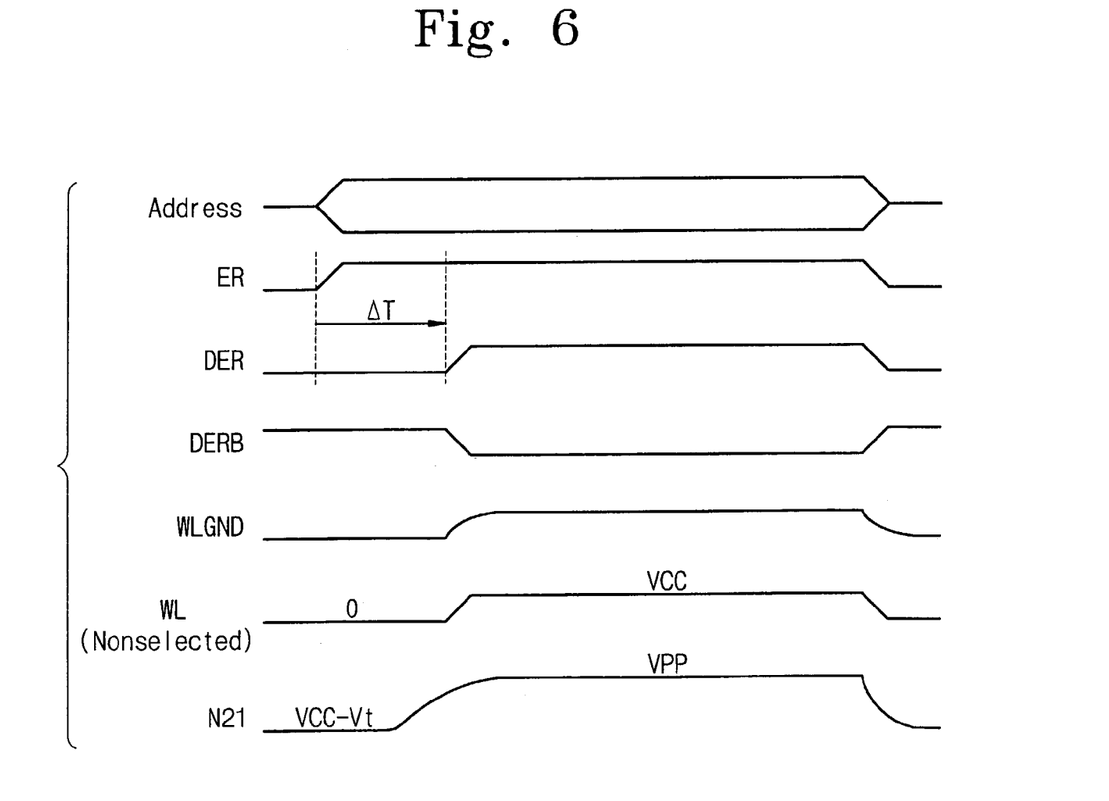
FIG. 6 is a timing diagram that illustrates operations of the wordline decoder embodiments according to the present invention.

Referring still to FIG. 6, embodiments according to the present invention can operate by providing a first voltage level at N22 from the row decoder to the wordline WL0. If the address provided to the row decoder during an erase mode operation of the flash memory indicates that WL0 is not selected by the erase operation, the first voltage level is increased to a second voltage level (such as VCC) provided from the row decoder. Moreover, the second voltage level is less than that needed to erase the memory cell that is electrically coupled to WL0.

In some embodiments according to the present invention, the increase in the first voltage level is provided by increasing the gate voltage of HVN12 towards a first reference voltage (such as VPP). The second reference voltage to a source/drain terminal of the transistor (such as WLGND) is increased to increase the first voltage level on WL0 towards the first reference voltage to provide the second voltage level.

It will be understood that increasing the second reference voltage (WLGND) can cause an upward shift in the reference voltage to which HVN12 pulls WL0 towards as the voltage applied to the gate of HVN12 increases (towards VPP) and therefore becomes more conductive. The upward shift in the reference voltage (WLGND) can decrease the source to drain voltage across HVP12, thereby allowing the increased voltage to be maintained on WL0 during non-selected erase more while reducing the likelihood that the breakdown voltage will be exceeded.

Therefore in some embodiments according to the present invention, a pseudo-ground voltage can be provided to the output stage of the row decoder to increase a voltage applied to the non-selected wordline without exceeding a breakdown voltage of a transistor included in the output stage. Moreover, the increase in the pseudo-ground voltage can be based on a control signal of the flash memory, such as the Erase signal (ER) as shown for example, in FIGS. 5 and 6.

As described above, the invention enhances erasure reliability by preventing a transfer of a high voltage to non-selected wordlines. Therefore, in cases where the sizes of transistors are reduced (such as those used in a split-gate flash memory), the breakdown voltage of a high-voltage transistor may not be exceeded to reduce the likelihood of transferring a high voltage to a wordline selected for erasure.

Although embodiments of the present invention have been disclosed for illustrative purposes, those skilled in the art will appreciate that various modifications, additions and substitutions are possible, without departing from the scope and spirit of the invention as described in the accompanying claims.

What is claimed:

1. A method of operating a row decoder of a flash memory comprising:
    providing a first voltage level from a row decoder to a wordline associated with a cell of a flash memory device;
    decoding an address provided to the row decoder during an erase mode operation of the flash memory;
    increasing the first voltage level to a second voltage level provided from the row decoder to the wordline responsive to determining that the wordline is not selected by the address during the erase mode operation; and
    increasing the first voltage level to a third voltage level that is greater than the second voltage level to the wordline responsive to determining that the wordline is selected by the address during the erase mode operation.

2. A method according to claim 1 wherein the second voltage level is less than that needed to erase a memory cell electrically coupled to the non-selected wordline.

3. A method of operating a row decoder of a flash memory comprising:
    providing a first voltage level from a row decoder to a wordline associated with a cell of a flash memory device;
    decoding an address provided to the row decoder during an erase mode operation of the flash memory;
    increasing the first voltage level to a second voltage level provided from the row decoder to the wordline responsive to determining that the wordline is not selected by the address during the erase mode operation, wherein the step of increasing comprises:
    increasing a gate voltage towards a first reference voltage at a gate terminal of a transistor having an output electrically coupled to the wordline to provide the second voltage level; and
    increasing a second reference voltage to a source/drain terminal of the transistor to increase the first voltage level on the wordline towards the first reference voltage to provide the second voltage level.

4. A method according to claim 3 wherein the transistor comprises a first transistor, the method further comprising:
decreasing a source to drain voltage across a second transistor, having a source/drain terminal thereof electrically coupled to the wordline, as the second reference voltage is increased.

5. A method according to claim 3 wherein the step of increasing the second reference voltage comprises delaying increasing the second reference voltage for a time interval based on a time for the gate voltage to increase above the second reference voltage.

6. A method according to claim 3 wherein the second reference voltage comprises a pseudo-ground voltage.

7. A method of operating a row decoder of a flash memory comprising:
providing a first voltage level from a row decoder to a wordline associated with a cell of a flash memory device;
decoding an address provided to the row decoder during an erase mode operation of the flash memory;
increasing the first voltage level to a second voltage level provided from the row decoder to the wordline responsive to determining that the wordline is not selected by the address during the erase mode operation, wherein the step of decoding further comprises:
passing a gate voltage through a pass transistor to a gate terminal of a transistor having an output electrically coupled to the wordline to provide the second voltage level.

8. A flash memory comprising:
a split-gate memory cell having source and drain regions formed in a semiconductor substrate, a channel region between the source and drain regions, a floating gate partially covering the source and channel regions, and a control gate over the channel region and the floating gate;
a wordline connected to the control gate; and
a wordline decoder configured to supply a first voltage to the wordline when the word line decoder is selected while to supply a second voltage to the wordline when the wordline is non-selected, in an erasure mode;
wherein the wordline decoder comprises: first means configured to charge a node to a second voltage in response to a first signal delayed from an erasure signal during the non-selection; second means configured to charge the wordline to a second voltage in response to the node during the non-selection; a first transistor for connecting the wordline to the first voltage in response to the node; and a second transistor for connecting the node to the first voltage in response to the wordline.

9. The flash memory of claim 8, wherein the first means comprises a high-voltage depletion transistor whose gate is coupled to the first signal, and a high-voltage NMOS transistor, whose gate is coupled to the second signal, connected between an address input terminal and the node in parallel with the depletion transistor.

10. The flash memory of claim 8, wherein the second means comprises a high-voltage NMOS transistor, whose gate is coupled to the node, connected between the wordline and the second signal.

11. The flash memory of claim 8, wherein the first and second signals are logically complementary each other.

12. The flash memory of claim 8, wherein the second voltage is transferred to the wordline by the send means when the wordline decoder is non-selected.

13. The flash memory of claim 8, wherein the first and second transistors are high-voltage PMOS transistors.

14. A flash memory comprising:
a split-gate memory cell having source and drain regions formed in a semiconductor substrate, a channel region between the source and drain regions, a floating gate partially covering the source and channel regions, and a control gate over the channel region and the floating gate;
a wordline connected to the control gate;
a bitline connected to the drain region;
a source line connected to the source region;
a node;
a first transistor for connecting a first voltage to the wordline in response to the node;
a second transistor for connecting the first voltage to the node in response to the wordline;
a third transistor for connecting an address input terminal to the node in response to a first signal delayed from an erasure signal;
a fourth transistor for connecting the address input terminal to the node in response to a second signal delayed from the erasure signal; and
a fifth transistor for connecting the wordline to the second signal in response to the node.

15. The flash memory of claim 14, wherein the first and second signals are logically complementary each other.

16. The flash memory of claim 14, wherein the first and second transistors are high-voltage PMOS transistors and the fourth and fifth transistors are high-voltage NMOS transistors.

17. The flash memory of claim 14, wherein the third transistor is a high-voltage NMOS depletion transistor.

* * * * *